(12) United States Patent
Chang et al.

(10) Patent No.: US 8,161,639 B2
(45) Date of Patent: Apr. 24, 2012

(54) METHOD FOR FABRICATING AN INTERLAYER CONDUCTING STRUCTURE OF AN EMBEDDED CIRCUITRY

(75) Inventors: Chien-Wei Chang, Taoyuan (TW); Ting-Hao Lin, Taipei (TW); Yu-Te Lu, Taoyuan (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 0 days.

(21) Appl. No.: 12/895,824

(22) Filed: Sep. 30, 2010

(65) Prior Publication Data

US 2011/0083323 A1 Apr. 14, 2011

(30) Foreign Application Priority Data

Oct. 9, 2009 (TW) .............................. 98134338 A

(51) Int. Cl.
*H01K 3/10* (2006.01)

(52) U.S. Cl. ................ 29/852; 29/830; 29/832; 29/833; 29/846

(58) Field of Classification Search .................... 29/830, 29/832, 833, 840, 846, 852
See application file for complete search history.

(56) References Cited

U.S. PATENT DOCUMENTS

| 6,323,439 | B1 * | 11/2001 | Kambe et al. | 174/262 |
| 7,371,974 | B2 * | 5/2008 | Toyoda et al. | 174/262 |
| 2003/0178229 | A1 * | 9/2003 | Toyoda et al. | 174/261 |

* cited by examiner

*Primary Examiner* — Carl Arbes
(74) *Attorney, Agent, or Firm* — Lin & Associates IP, Inc.

(57) ABSTRACT

A method for fabricating an interlayer conducting structure of an embedded circuitry is disclosed. In accordance with the method for fabricating an interlayer conducting structure of an embedded circuitry of the present invention, there is no laser conformal mask formed prior to laminating the first and second lamination plates. Instead, after the first and second lamination plates are laminated, a laser boring process is directly conducted to form a via hole. In such a way, even when there is an offset between the first and the second lamination plates in alignment, the risk of short circuit between different layers of lamination plates can be lowered without improving an interlayer offset value.

6 Claims, 6 Drawing Sheets

METHOD FOR FABRICATING AN INTERLAYER CONDUCTING STRUCTURE OF AN EMBEDDED CIRCUITRY

BACKGROUND OF THE INVENTION

1. Field of the Invention

The present invention relates generally to a method for fabricating an interlayer conducting structure of an embedded circuitry. More particularly, according to the method of the present invention, there is no laser conformal mask formed prior to laminating the lamination plates. Instead, after the lamination plates are laminated, a laser boring process is conducted to form a via hole. In such a way, the risk of short circuit between different layers of lamination plates can be lowered without improving an interlayer offset value.

2. The Prior Arts

For obtaining a larger area for wiring, most current printed circuit boards (PCB) are multilayer PCBs. Circuitries of different layers of such a multilayer PCB are typically connected by via holes, blind holes, or buried holes. However, since the multilayer PCB is fabricated by laminating a plurality of lamination plates one by one, there is often an offset when aligning different lamination plates for laminating.

Referring to FIG. 1, it is a schematic diagram illustrating a conventional interlayer conducting structure. As shown in FIG. 1, a first circuitry 7 and a target point 5 are formed on a first lamination plate 1. A conformal mask pattern 9 is formed on a second circuitry 11 by executing a laser conformal mask processing thereon. The second lamination plate 3 is then laminated to the first lamination plate 1. Then, a laser boring process is executed to bore from the conformal mask 9 of the second lamination pate 3 through the second lamination plate 3 positioned on a stop pad of the first circuitry 7, thus forming a via hole 14 which ends at the stop pad of the first circuitry 7.

In this conventional technology of fabricating the interlayer conducting structure, the conformal mask is formed prior to laminating the first and second lamination plates. As such, any alignment offset between different lamination plates may lead to an offset between the conformal mask and the stop pad. Correspondingly, the via hole may be bored down through the second lamination plate 3, as shown in the A portion indicated in FIG. 1, which brings the risk of short circuit.

SUMMARY OF THE INVENTION

A primary objective of the present invention is to provide a method for fabricating an interlayer conducting structure of an embedded circuitry. In accordance with the present invention, a first circuitry lamination plate having a first circuitry and a target point formed thereon is laminated with a second lamination plate having a second circuitry formed thereon. Then, the target point is targeted and accorded to for executing a laser boring process to bore through the second lamination plate positioned on a stop pad of the first circuitry, such that a via hole is configured on the stop pad. Then, a photoresist layer is formed on a part of the second lamination plate and a part of the second circuitry, and a conductive layer is then formed on the via hole and the rest part of the second lamination plate which is uncovered by the photoresist layer. Finally, the photoresist layer is removed away.

In accordance with the method for fabricating an interlayer conducting structure of an embedded circuitry of the present invention, there is no laser conformal mask formed prior to laminating the first and second lamination plates. Instead, after the first and second lamination plates are laminated, a laser boring process is directly conducted to form a via hole. In such a way, even when there is an offset between the first and the second lamination plates in alignment, the risk of short circuit between different layers of lamination plates can be lowered without improving an interlayer offset value.

BRIEF DESCRIPTION OF THE DRAWINGS

The present invention will be apparent to those skilled in the art by reading the following detailed description of preferred embodiments thereof, with reference to the attached drawings, in which.

DETAILED DESCRIPTION OF THE PREFERRED EMBODIMENT

Figure 1:
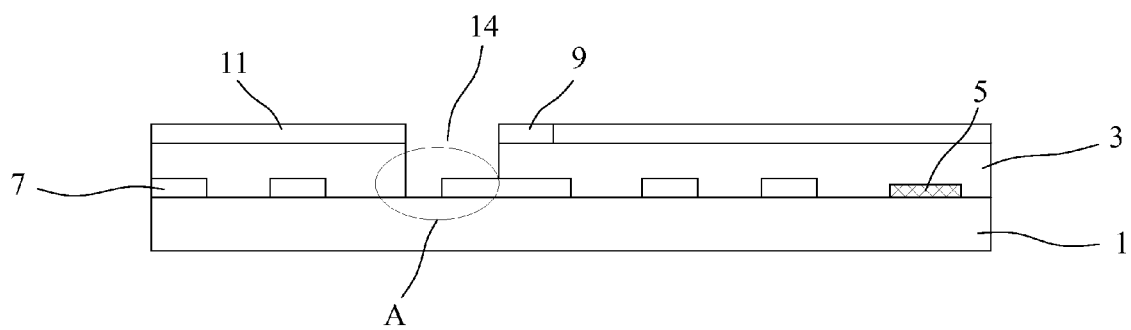
FIG. 1 is a schematic diagram illustrating a conventional interlayer conducting structure.

The accompanying drawings are included to provide a further understanding of the invention, and are incorporated in and constitute a part of this specification. The drawing illustrates embodiments of the invention and, together with the description, serves to explain the principles of the invention.

Figure 2:
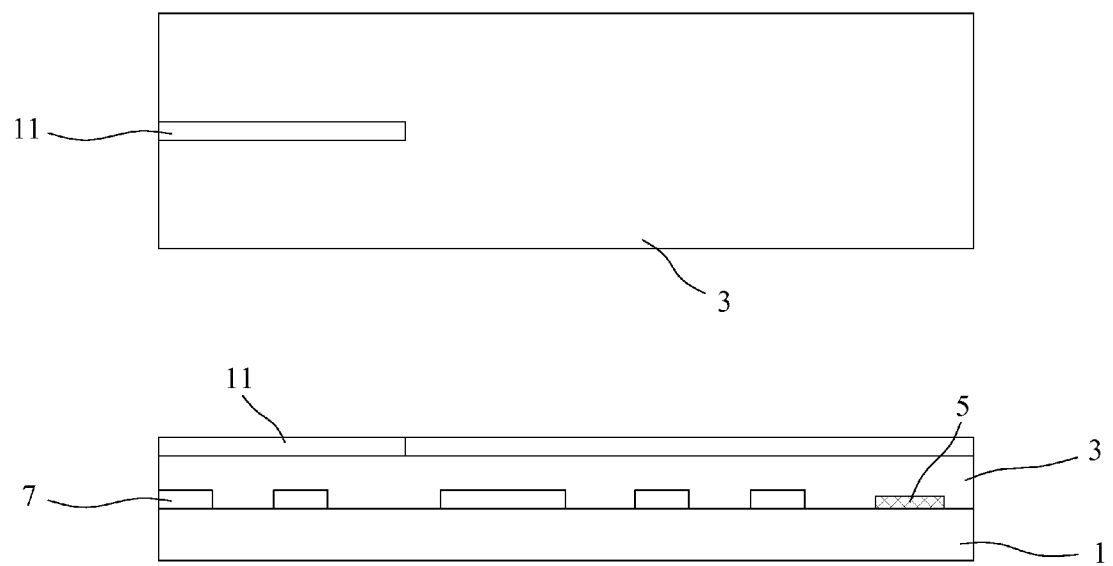
FIGS. 2 through 6 illustrate steps of a method for fabricating an interlayer conducting structure of an embedded circuitry according to an embodiment of the present invention, wherein each of FIGS. 2 through 6 includes a schematic top view and a schematic side view, respectively, for illustration.

FIGS. 2 through 6 are schematic side views and top views illustrating steps of a method for fabricating an interlayer conducting structure of an embedded circuitry according to an embodiment of the present invention. Referring to FIG. 2, at first, a first lamination plate 1 is prepared, on which a first circuitry 7 and at least one target point 5 are formed. A second lamination plate 3 is prepared, on which a second circuitry 11 is formed. The second lamination plate 3 is then laminated on the first lamination plate 1. As shown in FIG. 2, the second lamination plate 3 overlaps the first circuitry 7 and the target point 5.

Figure 3:
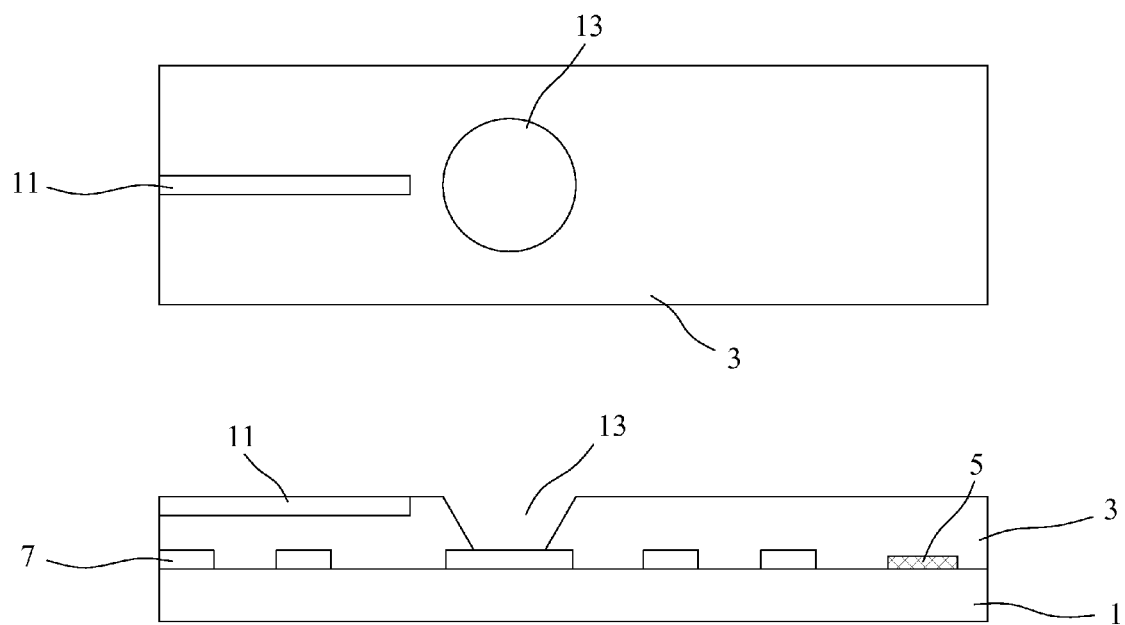

Then, referring to FIG. 3, the target point 5 is targeted for positioning and accorded to for executing a boring process to bore through the second lamination plate 3 positioned on a stop pad of the first circuitry 7, such that a via hole 13 is configured on the stop pad. Preferably, the boring process is a laser boring process, in which a mask is employed for determining a beam size of the laser and the diameter of the via hole 13. The laser boring process is executed in accordance with the position of the targeted target point 5 for alignment.

Figure 4:
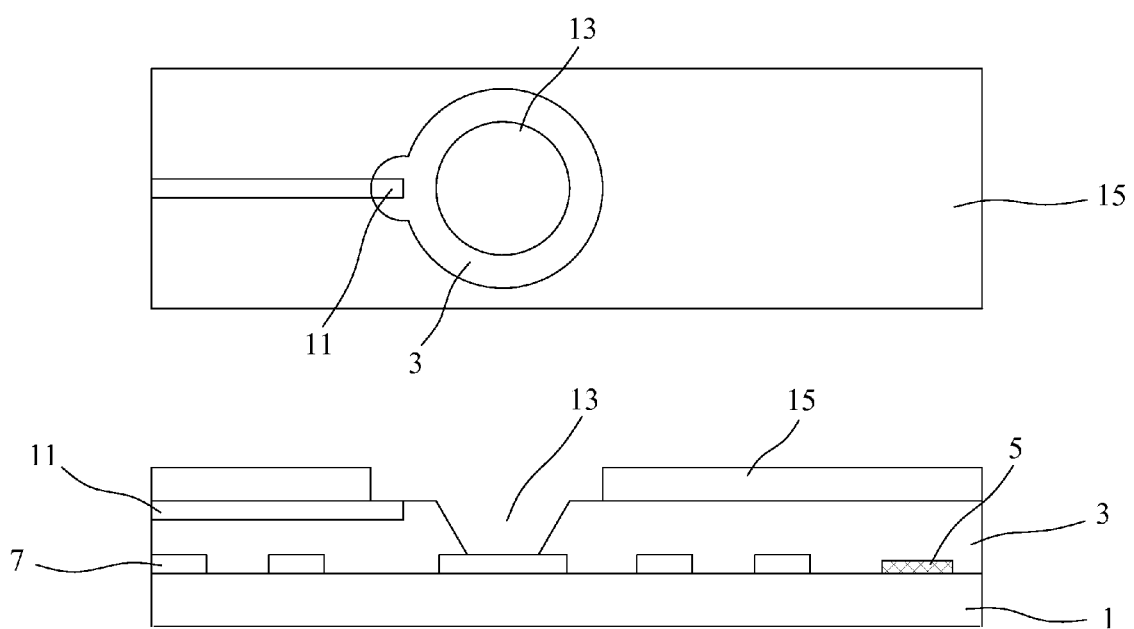
Figure 5:
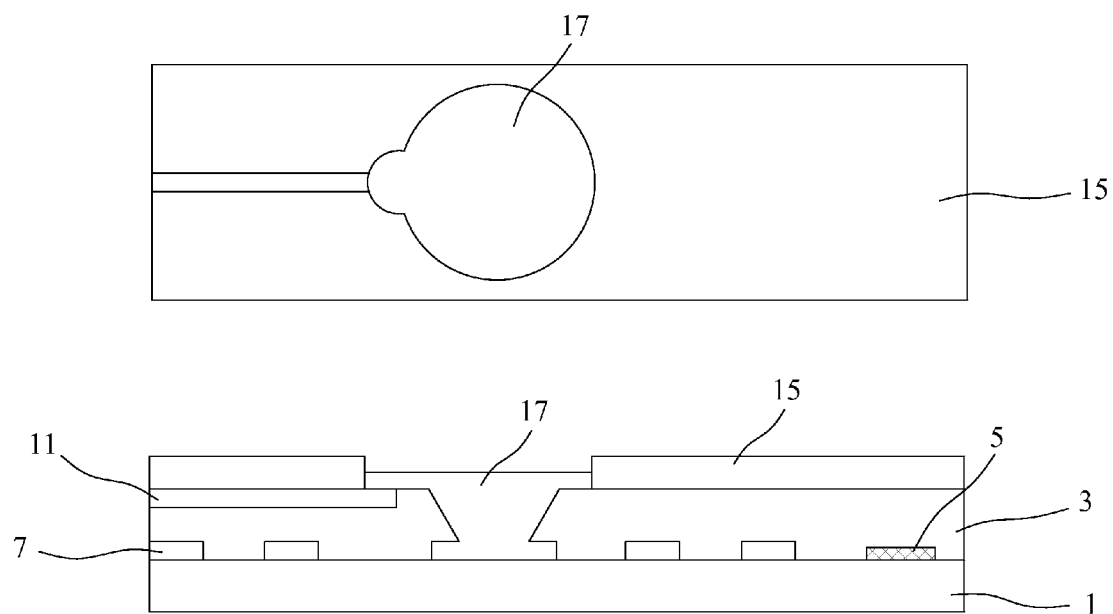
Figure 6:
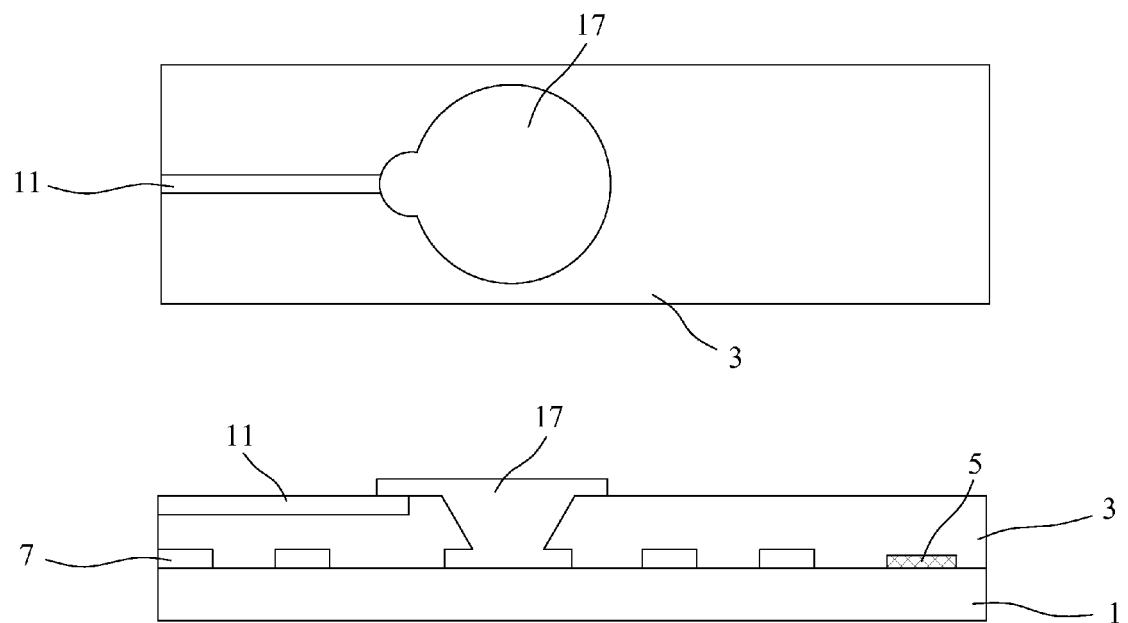

Then, referring to FIG. 4, a photoresist layer 15 is formed on a part of the second lamination plate 3 and a part of the second circuitry 11, and a conductive layer 17 is then formed in the via hole 13 and on the rest part of the second lamination plate 3 which is uncovered by the photoresist layer 15 by electroplating. Therefore, the first circuitry 7 is electrically connected with the second circuitry 11 as shown in FIG. 5. Finally, as shown in FIG. 6, the photoresist layer 15 is removed away.

It is worth to mention that the via hole 13 can be either a blind via hold or a buried via hole, the conductive layer 17 can be a metal layer, the photoresist layer 15 can be a dry film photoresist or a wet film photoresist, and the laser boring process may bore the via hole with a UV-YAG laser, or a UV-excimer laser.

In accordance with the method for fabricating an interlayer conducting structure of an embedded circuitry of the present invention, there is no laser conformal mask formed prior to laminating the first and second lamination plates. Instead, after the first and second lamination plates are laminated, a laser boring process is directly conducted to form a via hole. In such a way, even when there is an offset between the first and the second lamination plates in alignment, the risk of short circuit between different layers of lamination plates can be lowered without improving an interlayer offset value.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for fabricating an interlayer conducting structure of an embedded circuitry, comprising:
    forming a first circuitry and at least one target point on a first lamination plate;
    forming a second circuitry on a second lamination plate;
    laminating the second lamination plate on the first lamination plate, wherein the second lamination plate overlaps the first circuitry and the at least one target point;
    targeting the at least one target point for positioning;
    executing a boring method to form a via hole through the second lamination plate positioned on a stop pad of the first circuitry;
    providing a photoresist layer on a part of the second lamination layer and a part of the second circuitry;
    executing an electroplating process to form a conductive layer in the via hole and on the rest part of the second lamination plate which is uncovered by the photoresist layer for electrically connecting the first circuitry with the second circuitry; and
    removing the photoresist layer;
    wherein the boring method to form the via hole through the second lamination plate is accomplished by targeting and according the at least one target point for positioning without forming a conforming mask on the second lamination plate.

2. The method according to claim 1, wherein the boring method is a laser boring process employing a mask for determining a beam size of the laser and a diameter of the via hole.

3. The method according to claim 2, wherein the laser boring process bores the via hole with a UV-YAG laser, or a UV-excimer laser.

4. The method according to claim 1, wherein the via hole is a blind via hole or a buried via hole.

5. The method according to claim 1, wherein the photoresist layer is a dry film photoresist or a wet film photoresist.

6. The method according to claim 1, wherein the conductive layer is a metal layer.

* * * * *